(12) United States Patent
Kuwabara

(10) Patent No.: US 7,492,510 B2
(45) Date of Patent: Feb. 17, 2009

(54) OPTICAL ELEMENT HAVING ANTIREFLECTION FILM, AND EXPOSURE APPARATUS

(75) Inventor: Seiji Kuwabara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 308 days.

(21) Appl. No.: 11/557,573

(22) Filed: Nov. 8, 2006

(65) Prior Publication Data

US 2007/0103769 A1 May 10, 2007

(30) Foreign Application Priority Data

Nov. 9, 2005 (JP) .............................. 2005-325307

(51) Int. Cl.
*G02B 5/20* (2006.01)
(52) U.S. Cl. ...................... 359/359; 359/580; 359/586; 355/71
(58) Field of Classification Search .................. None
See application file for complete search history.

(56) References Cited

U.S. PATENT DOCUMENTS 2,391,595 A * 12/1945 Richards et al. ............. 359/581
7,301,695 B2 * 11/2007 Otani et al. ................. 359/359

OTHER PUBLICATIONS

Otani et al., Development of optical coating for 157-nm lithography. II. Reflectance, absorption, and scatter measurement, Applied Optics, vol. 41, No. 16, Jun. 1, 2002, pp. 3248-3255, Optical Society of America.

* cited by examiner

*Primary Examiner*—Sephone B. Allen
*Assistant Examiner*—Derek S Chapel
(74) *Attorney, Agent, or Firm*—Morgan & Finnegan, LLP

(57) ABSTRACT

An optical element includes a substrate that transmits a light having a central wavelength in a wave range between 150 nm and 250 nm, and an n-layer antireflection film that is formed on the substrate, and includes, from the substrate, an n−2-th layer made of a high refractive index material, an n−1-th layer made of an amorphous material containing $AlF_3$, and an n-th layer made of a low refractive index material, each of the high and low refractive index materials containing a crystalline material.

8 Claims, 4 Drawing Sheets

OPTICAL ELEMENT HAVING ANTIREFLECTION FILM, AND EXPOSURE APPARATUS

BACKGROUND OF THE INVENTION

The present invention relates generally to an optical element having an antireflection film, and more particularly to a structure of an antireflection film used for an optical element in an exposure apparatus. The present invention is suitable, for example, for an optical element used for an illumination optical system and a projection optical system in an exposure apparatus that uses an $F_2$ laser with a wavelength of about 157 nm for a light source.

In order to meet the recent demands for the fine processing, a projection exposure apparatus intends to improve the resolving power through use of the exposure light having a shorter wavelength. Recently, the exposure light source shifts from a KrF excimer laser (with a wavelength of approximately 248 nm) to an ArF excimer laser (with a wavelength of approximately 193 nm), and a development of the $F_2$ laser advances. In addition, since a highly durable or light-resistant optical element is required, an antireflection film or coating should be applied to the substrate to reduce a light amount loss, flare, and ghost, etc. caused by the surface reflections.

One known antireflection method only to the light having a single specific wavelength is a so-called V coat that stacks two layers made of a high refractive index material and a low refractive index material having an optical film thickness $\lambda_0/4$ from a substrate where $\lambda_0$ is a designed central wavelength. For example, one known antireflection film alternately layers $GdF_3$ and $MgF_2$. See, for example, Applied Optics, Vol. 41, No. 16, 1 Jun. 2002, pp. 3248-3255, "Development of Optical Coating for 157-nm Lithography. II. Reflectance, Absorption, and scatter measurement."

However, the exposure light having a short wavelength has such a high light energy that the light resistance of the antireflection film lowers. For example, the antireflection film that uses $GdF_3$ and $MgF_2$ deteriorates and remarkably decreases the transmittance to the $F_2$ laser beams of several tens of mega pulses. As a result of studies of the cause, this inventor has discovered that the conventional antireflection film has such a layered structure of two different crystalline materials that its surface becomes rough, and the high light energy causes organic materials to adhere to the surface of the antireflection film.

BRIEF SUMMARY OF THE INVENTION

The present invention is directed to an optical element equipped with a highly light-resistant antireflection film to an exposure light with a short wavelength, and an exposure apparatus having the optical system.

An optical element according to one aspect of the present invention includes a substrate that transmits a light having a central wavelength in a wave range between 150 nm and 250 nm, and an n-layer antireflection film that is formed on the substrate, and includes, from said substrate, an n−2-th layer made of a high refractive index material, an n−1-th layer made of an amorphous material containing $AlF_3$, and an n-th layer made of a low refractive index material, each of the high and low refractive index materials containing a crystalline material.

An optical element according to another aspect of the present invention includes a substrate that transmits a light having a central wavelength in a wave range between 150 nm and 250 nm, and an n-layer antireflection film that is formed on the substrate, and includes, from said substrate, an n−1-th layer made of a high refractive index material, an n-th layer made of a low refractive index material and an amorphous material containing $AlF_3$, each of the high and low refractive index materials containing a crystalline material.

An exposure apparatus according to another aspect of the present invention includes the above optical element, and uses the optical element to expose a plate.

A device manufacturing method according to still another aspect of the present invention includes exposing a plate using the above exposure apparatus, developing the plate that has been exposed. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

The conventional antireflection film generally has a layered structure that alternately layers a high refractive index material and a low refractive index material. The final layer is made of the low refractive index material. This inventor has initially studied an addition of an amorphous material to the thus structured antireflection film. The amorphous material has an effect of reducing the surface roughness when combined with the crystalline material. One illustrative amorphous material is $AlF_3$ that is a low refractive index material. Although it is conceivable to arrange $AlF_3$ in the final layer of the antireflection film farthest from the substrate in the optical element, $AlF_3$ is deliquescent and lowers the durability of the antireflection film if located in the final layer.

Figure 1:
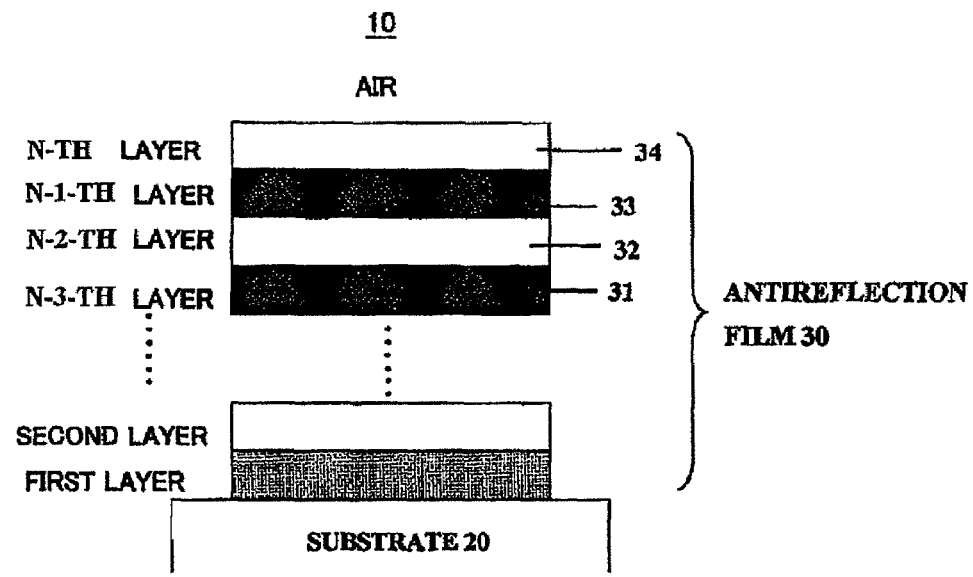
FIG. 1 is an enlarged sectional view of an optical element having an antireflection film according to one aspect of the present invention.

Referring to FIG. 1, a description will be given of an optical element 10 that solves this problem according to one embodiment of the present invention. Here, FIG. 1 is a schematic sectional view of the optical element 10. The optical element 10 is a dioptric (refractive) optical element in which an antireflection film 30 that improves the reflectance of the light is formed on a substrate 20.

The substrate 20 is a transparent substrate made of single crystal such as $CaF_2$, $MgF_2$, and $BaF_2$.

The antireflection film 30 is an n-layer film having a layered structure that (basically) alternately layers a high refractive index material and a low refractive index material, where n is an integer. The low refractive index material is selected, for example, from $CaF_2$, $MgF_2$, $BaF_2$, $AlF_3$, NaF, LiF, $SrF_2$, $Na_3AlF_6$, $Na_5Al_3F_{14}$, and a composite material of two or more of these materials. The high refractive index material is selected, for example, from $NdF_3$, $LaF_3$, $YF_3$, $GdF_3$, $DyF_3$, $PbF_2$, or a composite material of two or more of these materials. Both the high and low refractive index materials contain a crystalline material.

An n−2-th layer 32 from the substrate 20 to the air layer is made of the high refractive index material. An n−1-th 33 is made of an amorphous material containing $AlF_3$. An n-th layer or final layer 34 is made of the low refractive index material. Alternatively, the n-th layer may be a composite thin film of $MgF_2$ and $AlF_3$. The n−1-th layer 33 and the n−3-th layer 31 may be made of an amorphous material containing $AlF_3$. A structure from the first layer to the n−2-th layer 32 is a layered structure that alternately layers a high refractive index material and a low refractive index material. When the n−3-th layer 31 is made of an amorphous material containing $AlF_3$, a structure from the first layer to the n−4-th layer is a layered structure that alternately layers a high refractive index material and a low refractive index material.

The amorphous material containing $AlF_3$ in the n−1-th layer 33 or n−1-th layer 33 and the n−3-th layer 31 mitigates the surface roughness on the final surface of the antireflection film made of a crystalline material. In addition, the final surface that dispenses with $AlF_3$ prevents the antireflection film from deteriorating due to the deliquescent characteristic.

This embodiment uses, but is not limited to, a vacuum evaporation method for a film formation. Various numerical examples of the antireflection film of this embodiment will be discussed below:

First Embodiment

A designed central wavelength $\lambda_0$ is an oscillation wavelength of 157 nm of the $F_2$ laser, and the substrate is calcium fluoride (with a refractive index: 1.55). The low refractive index material layer is made of $MgF_2$ (with a refractive index: 1.44) and $AlF_3$ (with a refractive index: 1.41), and the high refractive index material layer is made of $GdF_3$ (with a refractive index: 1.77). Table 1 summarizes a film thickness of each layer in the antireflection film:

TABLE 1

| | Material | Optical Film Thickness |
|---|---|---|
| Substrate | $CaF_2$ | |
| 1st Layer | $GdF_3$ | $0.25 \lambda_0$ |
| 2nd Layer | $AlF_3$ | $0.125 \lambda_0$ |
| 3rd Layer | $MgF_3$ | $0.125 \lambda_0$ |
| Medium | air | |

Figure 2:
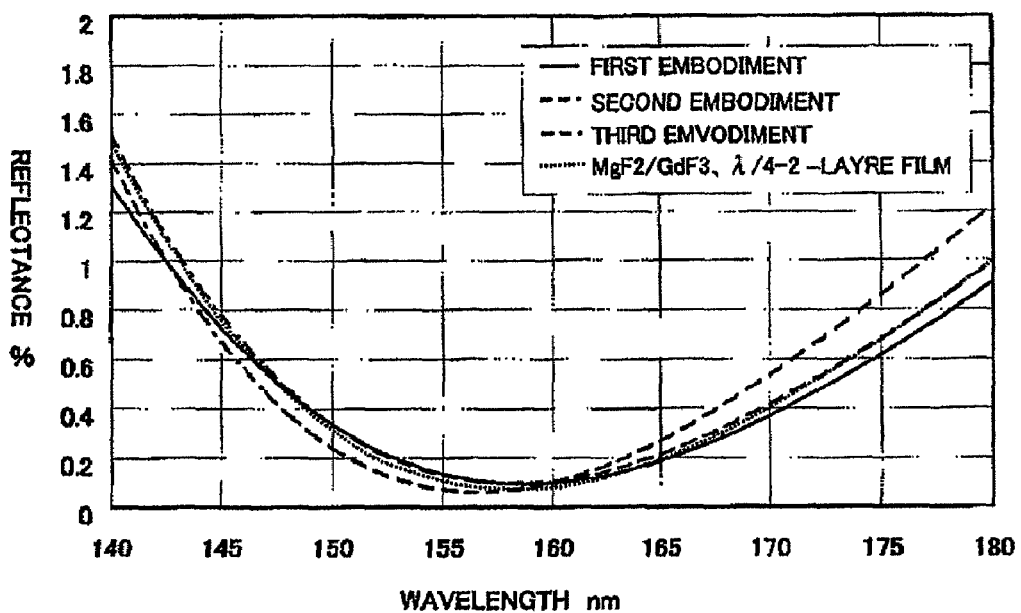
FIG. 2 is a graph of a wavelength reflectance characteristic that compares a conventional antireflection film with antireflection films according to first to third embodiments.
Figure 3:
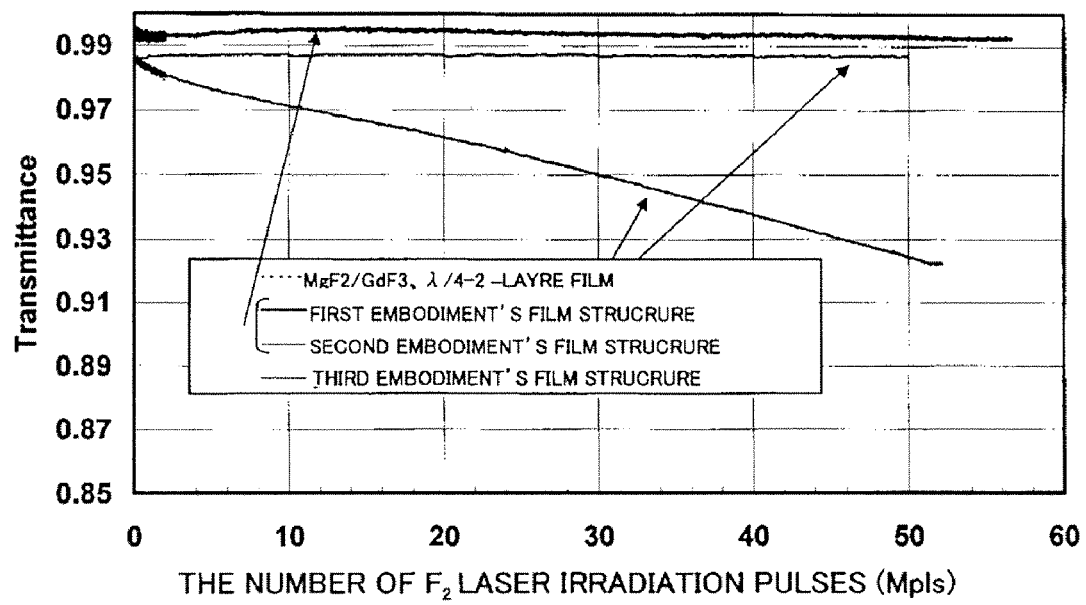
FIG. 3 is a graph of a wavelength reflectance characteristic that compares the conventional antireflection film with the antireflection films according to the first to third embodiments.
Figure 4:
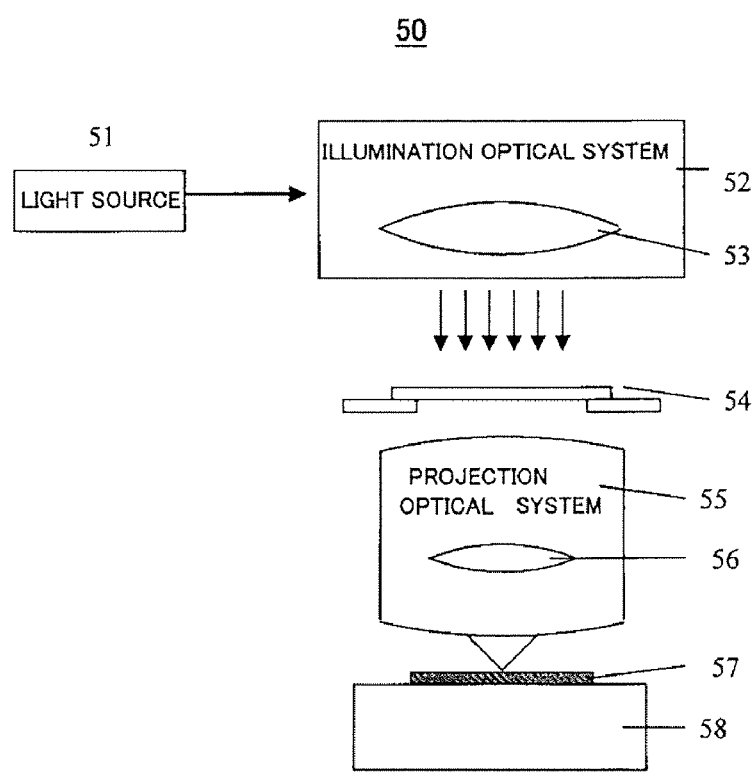
FIG. 4 is a schematic block diagram of an exposure apparatus that includes an optical element shown in FIG. 1.

FIG. 2 shows a spectrum reflectance characteristic at an incident angle of 0° of the antireflection coating in the first embodiment. A low reflectance of 0.3% or smaller is obtained from FIG. 2 in a wave range near the wavelength of 157 nm. It is understood from FIG. 3 that to the irradiation of the $F_2$ laser having a light intensity 20 mJ/cm², the antireflection film of this embodiment exhibits a light resistance better than the two-layer antireflection film of Applied Optics, Vol. 41, No. 16, 1 Jun. 2002, pp. 3248-3255, "Development of Optical Coating for 157-nm Lithography. II. Reflectance, Absorption, and scatter measurement."

Second Embodiment

A designed central wavelength $\lambda_0$ is an oscillation wavelength of 157 nm of the $F_2$ laser, and the substrate is calcium fluoride (with a refractive index: 1.55). The low refractive index material layer is made of $MgF_2$ (with a refractive index: 1.44) and $AlF_3$ (with a refractive index: 1.41), and the high refractive index material layer is made of $GdF_3$ (with a refractive index: 1.77). Table 2 summarizes a film thickness of each layer in the antireflection film:

TABLE 2

| | Material | Optical Film Thickness |
|---|---|---|
| Substrate | $CaF_2$ | |
| 1st Layer | $GdF_3$ | $0.25 \lambda_0$ |
| 2nd Layer | $AlF_3$ | $0.625 \lambda_0$ |
| 3rd Layer | $MgF_3$ | $0.625 \lambda_0$ |
| 4th Layer | $AlF_3$ | $0.625 \lambda_0$ |
| 5th Layer | $MgF_3$ | $0.625 \lambda_0$ |
| Medium | air | |

FIG. 2 shows a spectrum reflectance characteristic at an incident angle of 0° of the antireflection coating in the second embodiment. A low reflectance of 0.3% or smaller is obtained from FIG. 2 in a wave range near the wavelength of 157 nm. Similar to the first embodiment, it is understood from FIG. 3 that to the irradiation of the $F_2$ laser having a light intensity 20 mJ/cm², the antireflection film of this embodiment exhibits a light resistance better than the two-layer antireflection film of Applied Optics, Vol. 41, No. 16, 1 Jun. 2002, pp. 3248-3255, "Development of Optical Coating for 157-nm Lithography. II. Reflectance, Absorption, and scatter measurement."

Third Embodiment

A designed central wavelength $\lambda_0$ is an oscillation wavelength of 157 nm of the $F_2$ laser, and the substrate is calcium fluoride (with a refractive index: 1.55). The low refractive index material layer is a composite film made of $MgF_2$ (with a refractive index: 1.44) and $AlF_3$ (with a refractive index: 1.41) with a composite ratio of 1:1, and the high refractive index material layer is made of $GdF_3$ (with a refractive index: 1.77). Table 3 summarizes a film thickness of each layer in the antireflection film:

TABLE 3

| | Material | Optical Film Thickness |
|---|---|---|
| Substrate | $CaF_2$ | |
| 1st Layer | $GdF_3$ | $0.25 \lambda_0$ |
| 2nd Layer | $AlF_3 + MgF_3$ (1:1 composite film) | $0.25 \lambda_0$ |
| Medium | air | |

FIG. 2 shows a spectrum reflectance characteristic at an incident angle of 0° of the antireflection coating in the second embodiment. A low reflectance of 0.3% or smaller is obtained from FIG. 2 in a wave range near the wavelength of 157 nm. Similar to the first and second embodiments, it is understood from FIG. 3 that to the irradiation of the $F_2$ laser having a light intensity 20 mJ/cm², the antireflection film of this embodiment exhibits a light resistance better than the two-layer antireflection film of Applied Optics, Vol. 41, No. 16, 1 Jun. 2002, pp. 3248-3255, "Development of Optical Coating for 157-nm Lithography. II. Reflectance, Absorption, and scatter measurement."

Fourth Embodiment

Figure 5:
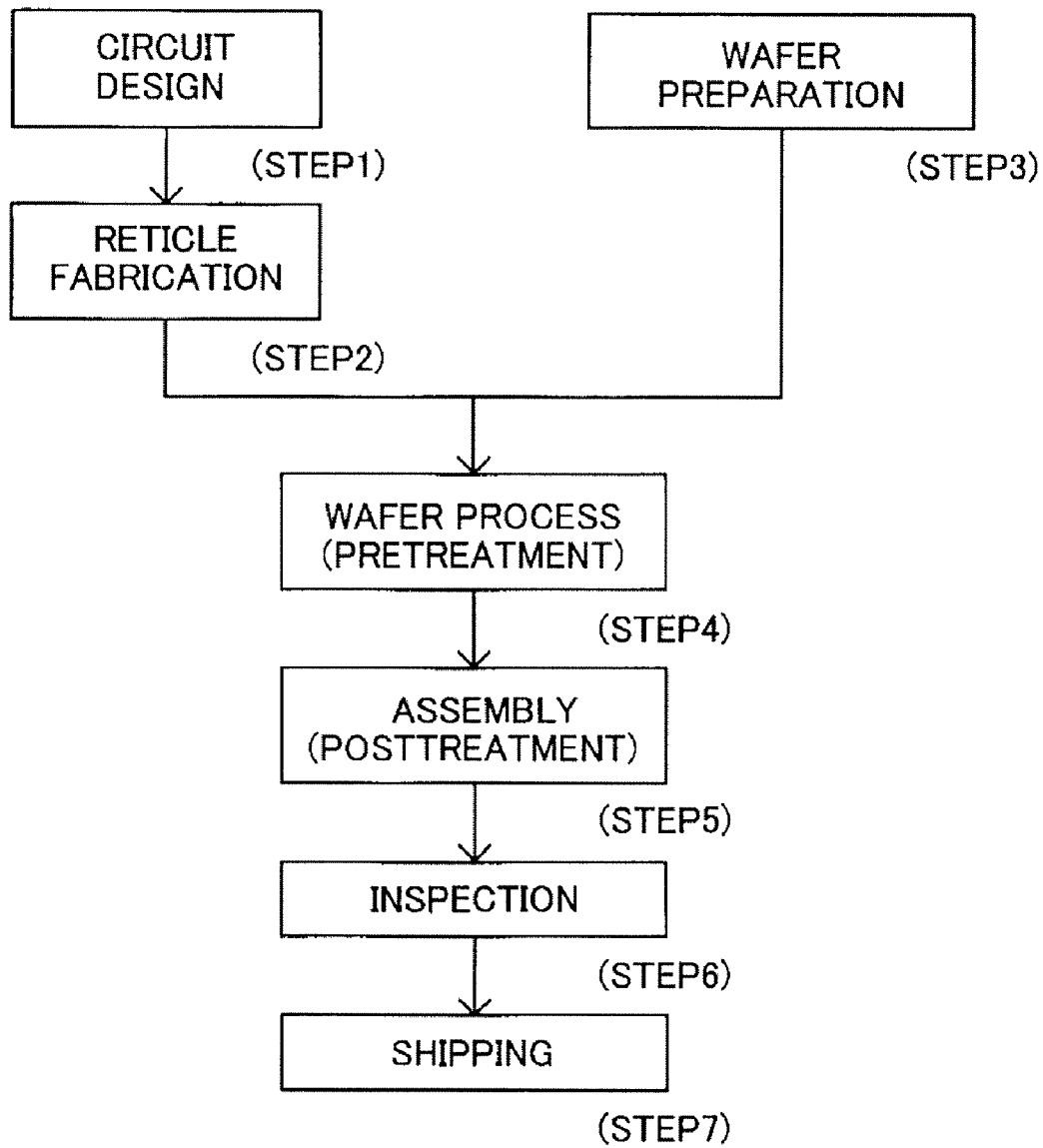
FIG. 5 is a flowchart for explaining a device manufacturing method using the exposure apparatus shown in FIG. 4.

A description will now be given of an exposure apparatus 50 to which the optical element 10 is applied. Here, FIG. 5 is a schematic view of principal part of the exposure apparatus 50. The exposure apparatus is a projection exposure apparatus that exposes a pattern image of a reticle 54 onto a wafer 57 coated with a photoresist. The exposure apparatus 50 uses a step-and-repeat system, but may use a step-and-scan system.

51 denotes a light source that emits the UV light, such as the $F_2$ laser and the ArF excimer laser. 52 denotes an illumination optical system that illuminates the reticle 54 using a light from the light source 51. 58 denotes a wafer stage. 55 denotes a projection optical system that projects a pattern of the reticle 54 onto the wafer 57. The optical element 10 is suitable for lenses 53 and 56 for the illumination and projection optical systems 52 and 55. Thereby, the exposure apparatus 50 uses an optical element having an excellent light resistance to the exposure light having a short wavelength for high-quality exposure at a high resolution.

Fifth Embodiment

Figure 6:
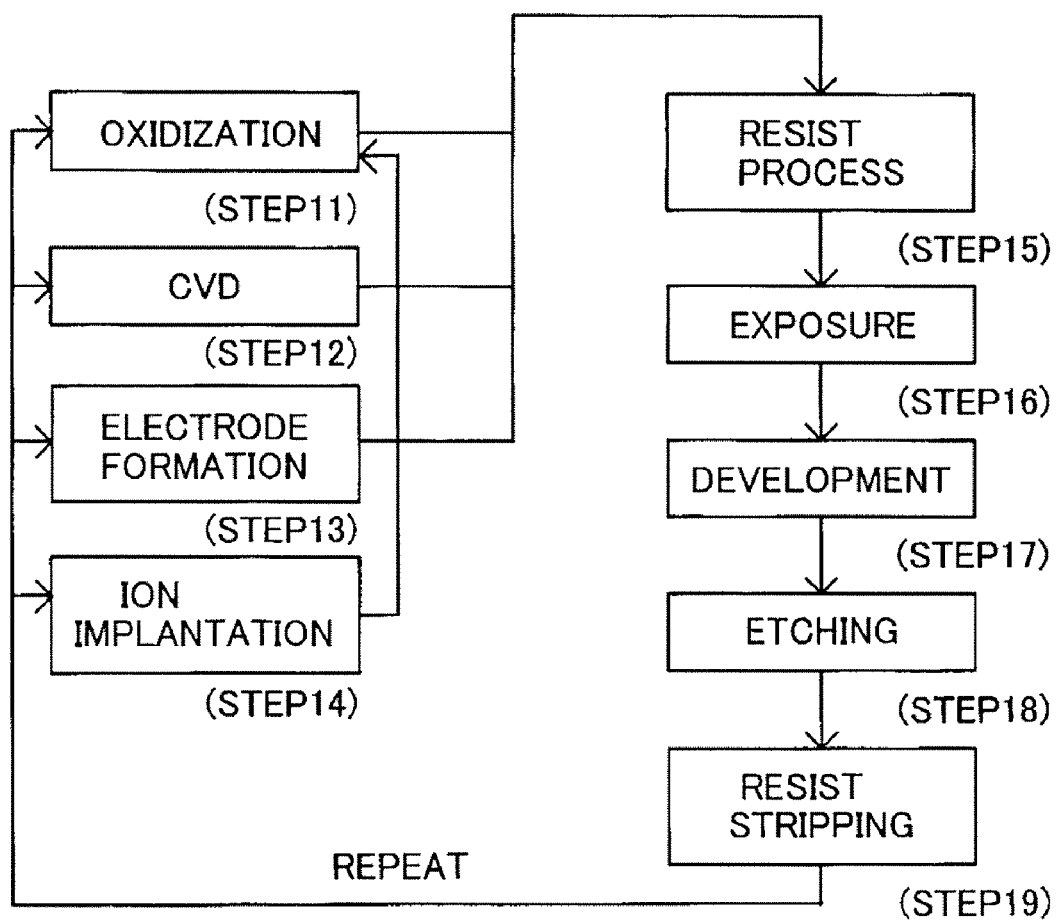
FIG. 6 is a detailed flowchart of a wafer process as Step 4 shown in FIG. 5.

Referring now to FIGS. 5 and 6, a description will now be given of an embodiment of a device manufacturing method using the exposure apparatus 50. FIG. 5 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 6 is a detailed flowchart of the wafer process in Step 4 shown in FIG. 5. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 50 to expose a mask pattern onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. This device manufacturing method can manufacture higher quality devices, such as a semiconductor device, an LCD device, an imaging device (a CCD etc.), and a thin-film magnetic head, than ever, since the optical element can maintain the transmittance. Thus, the device manufacturing method that uses the exposure apparatus 50, and its (final and intermediate) resultant products also constitute one aspect of the present invention.

Further, the present invention is not limited to these preferred embodiments, and various variations and modifications may be made without departing from the scope of the present invention.

This application claims a benefit of priority based on Japanese Patent Application No. 2005-325307, filed on Nov. 9, 2005, which is hereby incorporated by reference herein in its entirety as if fully set forth herein.

What is claimed is:

1. An optical element comprising:
   a substrate that transmits a light having a central wavelength in a wave range between 150 nm and 250 nm; and
   an n-layer antireflection film that is formed on the substrate, and includes, from said substrate, an n−2-th layer made of a high refractive index material, an n−1-th layer made of an amorphous material containing $AlF_3$, and an n-th layer made of a low refractive index material, each of the high and low refractive index materials containing a crystalline material, wherein n is an integer greater than or equal to 4.

2. An optical element according to claim 1, wherein said n-layer antireflection film further includes, from said substrate, an n−3-th layer made of an amorphous material containing $AlF_3$.

3. An optical element according to claim 1, wherein the low refractive index material is selected from $CaF_2$, $MgF_2$, $BaF_2$, $AlF_3$, NaF, LiF, $SrF_2$, $Na_3AlF_6$, $Na_5Al_3F_{14}$, and a composite material of two or more of $CaF_2$, $MgF_2$, $BaF_2$, $AlF_3$, NaF, LiF, $SrF_2$, and $Na_3AlF_6$, $Na_5Al_3F_{14}$, and the high refractive index material is selected from $NdF_3$, $LaF_3$, $YF_3$, $GdF_3$, $DyF_3$, $PbF_2$, and a composite material of two or more of $NdF_3$, $LaF_3$, $YF_3$, $GdF_3$, $DyF_3$, and $PbF_2$.

4. An exposure apparatus comprising an optical element according to claim 1, and using the optical element to expose a plate.

5. A device manufacturing method comprising:
   exposing a plate using an exposure apparatus that includes an optical element according to claim 1;
   developing the plate that has been exposed.

6. An optical element comprising:
   a substrate that transmits a light having a central wavelength in a wave range between 150 nm and 250 nm; and
   an n-layer antireflection film that is formed on the substrate, and includes, from said substrate, an n−1-th layer made of a high refractive index material, an n-th layer made of a low refractive index material and an amorphous material containing $AlF_3$, each of the high and low refractive index materials containing a crystalline material, wherein n is an integer greater than or equal to 2.

7. An exposure apparatus comprising an optical element according to claim 6, and using the optical element to expose a plate.

8. A device manufacturing method comprising:
   exposing a plate using an exposure apparatus that includes an optical element according to claim 6;
   developing the plate that has been exposed.

* * * * *